(12) United States Patent
Shirai et al.

(10) Patent No.: US 6,338,937 B1
(45) Date of Patent: Jan. 15, 2002

(54) LITHOGRAPHY METHOD AND METHOD FOR PRODUCING A WIRING BOARD

(75) Inventors: Masaharu Shirai, Kusatsu; Shinji Yamada, Ohtsu, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/454,208

(22) Filed: Dec. 9, 1999

(30) Foreign Application Priority Data

Dec. 10, 1998 (JP) .......................................... 10-350916

(51) Int. Cl.[7] .............................. H05K 3/06; H05K 3/46; G03F 7/26; G03F 7/38
(52) U.S. Cl. ...................... 430/313; 430/302; 430/317; 29/829
(58) Field of Search ................................. 430/302, 317, 430/313; 29/829

(56) References Cited

FOREIGN PATENT DOCUMENTS

EP            449318      *  2/1991

* cited by examiner

*Primary Examiner*—Shean C. Wu
(74) *Attorney, Agent, or Firm*—Lawrence R. Fraley (57) ABSTRACT

The method of producing a wiring board comprises the steps of: preparing a photosensitive resin layer; pressing the photosensitive resin layer; exposing the pressed photosensitive resin layer to light by using a exposure mask on which a predetermined pattern is formed; and developing the exposed photosensitive resin layer.

15 Claims, 11 Drawing Sheets

LITHOGRAPHY METHOD AND METHOD FOR PRODUCING A WIRING BOARD

FIELD OF THE INVENTION

The present invention relates to a lithography method and a method for producing a wiring board, and more particularly relates to a method of producing a laminate having a circuit pattern built up on a substrate through an insulating photosensitive resin layer without generating any voids or bubbles in the insulating layer (photosensitive resin layer).

BACKGROUND OF THE INVENTION

For example, in the method of producing a built-up laminate, the most important technical challenge is to prevent voids from being created during the formation of an insulating layer. The voids created in the insulating layer are classified into following three types:

1. voids created by bubbles contained in resin during the coating process;
2. voids created in the insulating layer by shadows of contaminant matter adhering to the pattern mask (glass) and the exposure equipment during the exposing process; and
3. voids created by shadows of contaminant matter adhering to the surface of the photosensitive resin during the exposing process.

Of the above three types of voids, the voids created by bubbles entered in the resin during the coating process is found to be negligibly small, so that no troubles such as short circuit or shortage of withstand voltage erupt. The voids created by shadows of contaminant matter adhering to the pattern mask and the like can be removed by being exposed to light twice. In the meanwhile, in order to prevent the creation of voids, contaminant matter adhering to the surface of photosensitive resin has been so far removed by using a roller coated with adhesive agent in such a way to attach the contaminant matter to the adhesive agent of the roller. It has been considered that the creation of voids can be effectively prevented in this way. However, close inspection reveals that voids are created on the surface of photosensitive resin layer, because the contaminant matter is not completely removed from the surface by the adhesive roller. Thus, some of the contaminant matter left on the surface causes the creation of voids.

Figure 14A:
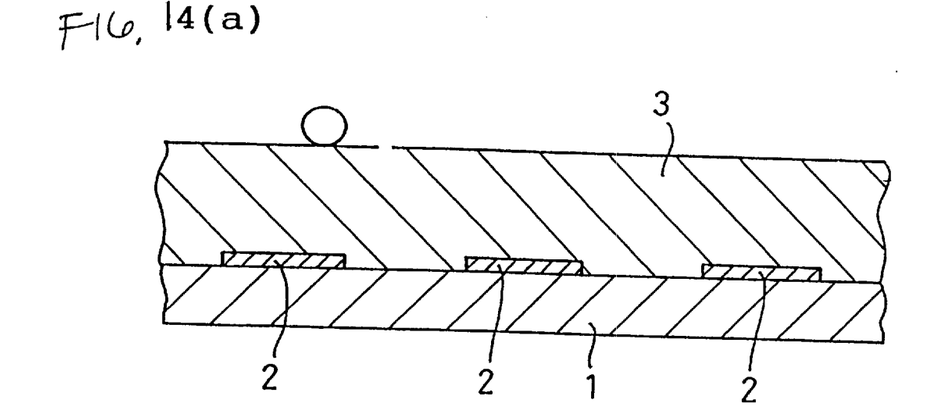
FIGS. 14(a) to 14(c) each are an explanatory sectional view showing a major part of each step in a conventional method of producing a wiring board.
Figure 14B:
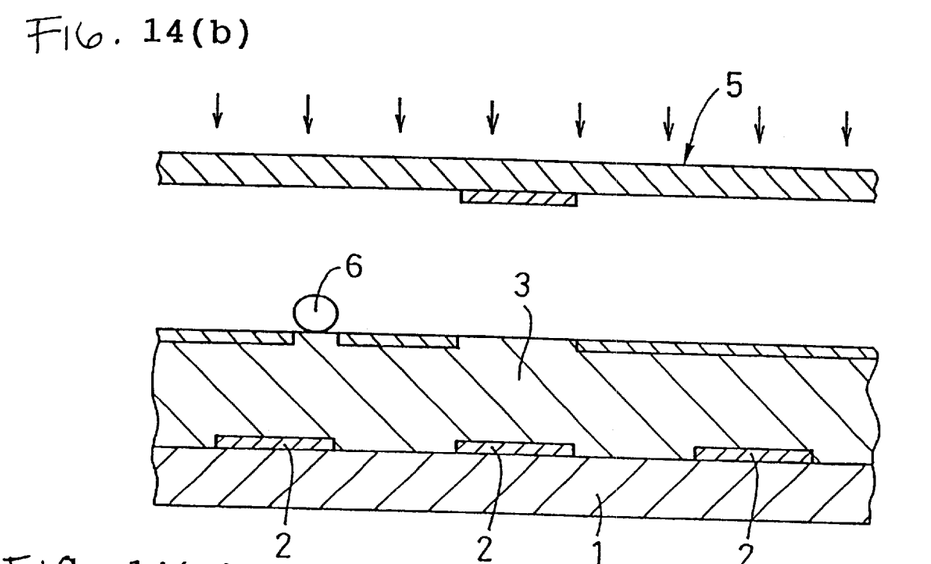
Figure 14C:
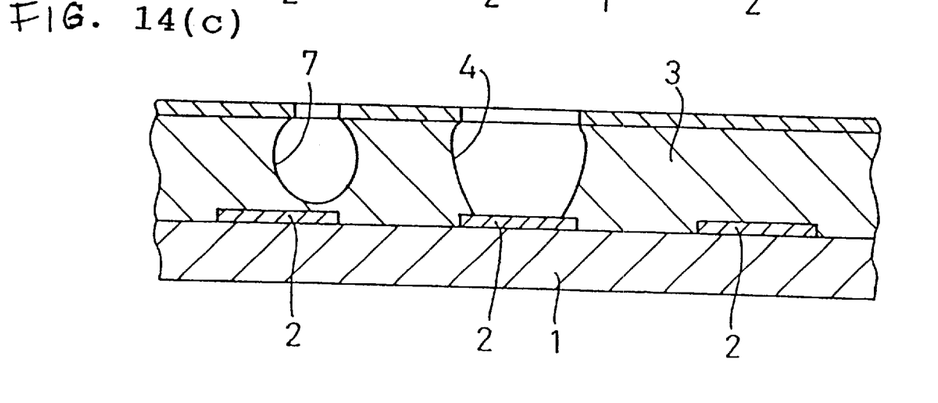

Next, the cause of voids created in the photosensitive resin layer by contaminant matter will be explained below. As shown in FIG. 14(a), wirings 2 with a predetermined shape are formed on the insulating substrate 1, and a photosensitive resin layer 3 is formed on the substrate 1 and the wirings 2. A photomask 5, on which a shielding pattern is formed, is positioned as shown in FIG. 14(b), and then the photosensitive resin layer 3 is exposed to light so as to form a via hole 4 in a predetermined position of the photosensitive resin layer 3 as shown in FIG. 14(c). At this time, if contaminant matter 6 is on the surface of the photosensitive resin layer 3, it functions as a part of the shielding pattern, so that the photosensitive resin layer behind the contaminant matter 6 is not exposed to light. After performing several steps in a general manner, the developing step is carried out as shown in FIG. 14(c). Generally, in the developing step, the photosensitive resin layer 3 is overdeveloped to form the via hole 4 and the like. During this developing step, the contaminant matter 6 comes off from the photosensitive resin layer, and the part of the photosensitive resin layer 3, which is behind the contaminant matter 6 during the light exposure, is developed. Thus, a void 7 is formed on the photosensitive resin layer 3.

Figure 15A:
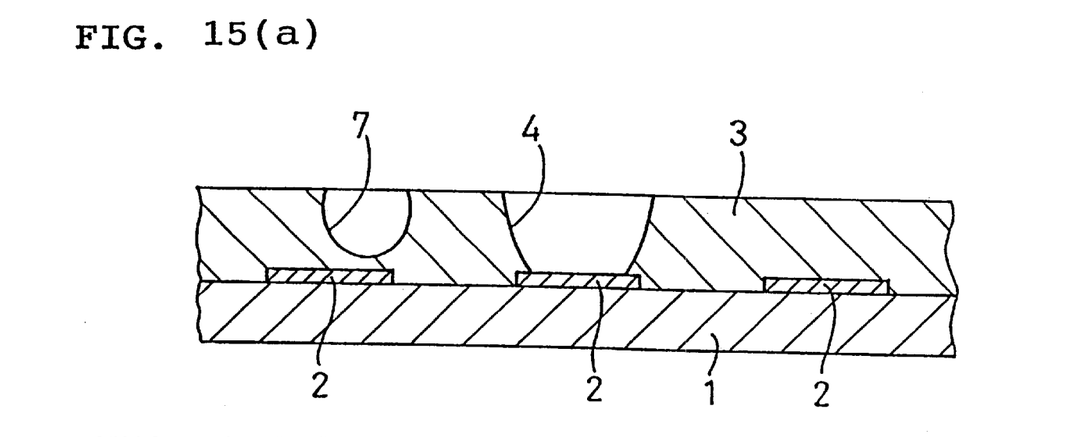
FIGS. 15(a) to 15(c) are explanatory sectional views showing major parts of steps subsequent to the steps shown in FIGS. 14(a) to 14(c) in the conventional method of producing a wiring board.
Figure 15B:
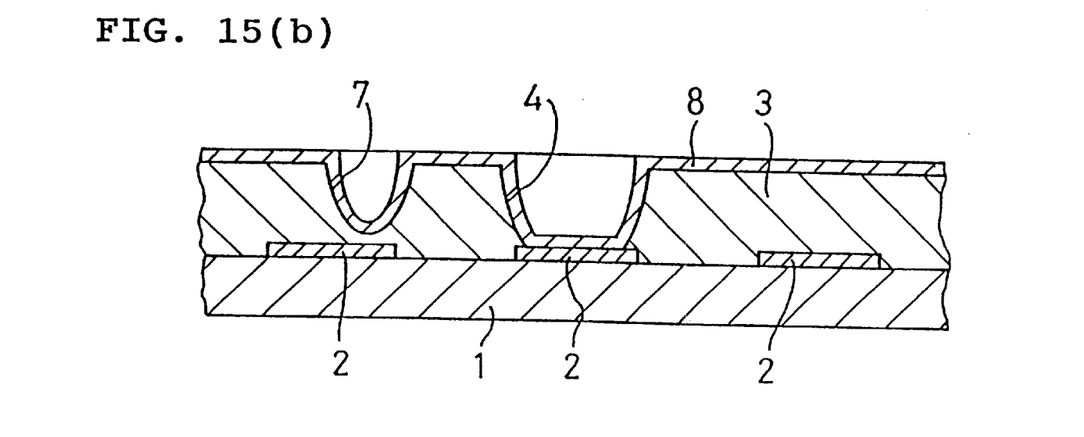
Figure 15C:
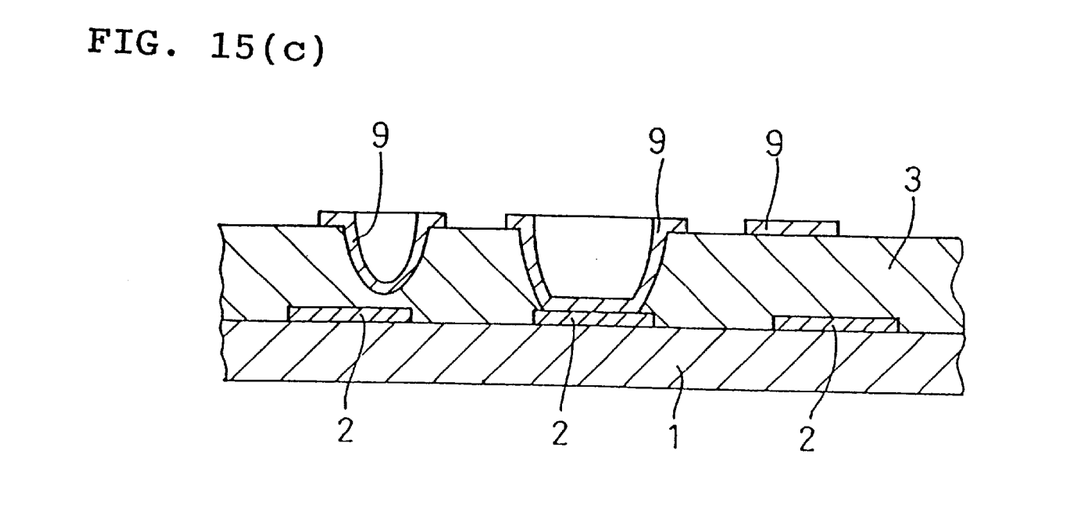

When the void 7 is created, the following problem arises. In order to produce a wiring board, the surface of the photosensitive resin layer 3 is removed by being ground as shown in FIG. 15(a), and then a conductive layer 8 is formed on the photosensitive resin layer 3 as shown in FIG. 15(b). Thereafter, as shown in FIG. 15(c), an upper wiring 9 is formed by developing the conductive layer 8 in a general manner, and thus the wiring board is produced. In producing the wiring board, when the upper wiring 9 is overlapped with the void 7 of the photosensitive resin layer 3, short circuit occurs if the upper wiring 9 on the bottom of the void 7 is brought into contact with the lower wiring 2, or a sharp reduction of withstand voltage occurs if the spacing between the two wirings 9 and 2 is narrow.

OBJECTS AND SUMMARY OF THE INVENTION

An object of the present invention is to prevent voids and bubbles from being created in the photosensitive resin layer by contaminant matter adhering to the photosensitive resin layer.

Another object of the present invention is to provide a method for producing a wiring board, whereby the creation of voids and bubbles on the photosensitive resin layer can be prevented and short circuit between wirings and reduction in withstand voltage can be prevented.

BEST MODE FOR CARRYING OUT THE INVENTION

For a better understanding of the present invention together with other and further objects, advantages and capabilities thereof, reference is made to the following disclosure and appended claims in connection with the above-described drawings. It is understood that like numerals may be used to indicate like elements from Figure to Figure.

The lithography method and the method for producing a wiring board according to the present invention comprise the steps of: preparing a photosensitive resin layer; pressing the photosensitive resin layer; exposing the pressed photosensitive resin layer to light by using an exposing mask; and developing the exposed photosensitive resin layer. By using this method, contaminant matter adhering to the surface of the photosensitive resin layer can be pressed into the photosensitive resin layer. For this reason, when the photosensitive resin layer is removed in the developing or etching step, contaminant matter is also removed at the same time. In the meanwhile, when the photosensitive resin layer is not removed, contaminant matter is not removed, either. In the conventional method, contaminant matter comes off from the photosensitive resin layer in the developing step and the like, so that voids and bubbles are created by developing or etching the photosensitive resin layer. However, in the present method, no voids or bubbles are created in the photosensitive resin layer.

With reference to the accompanying drawings, preferred embodiments of the lithography method and the method for producing a wiring board according to the present invention will be described in detail below.

Figure 1:
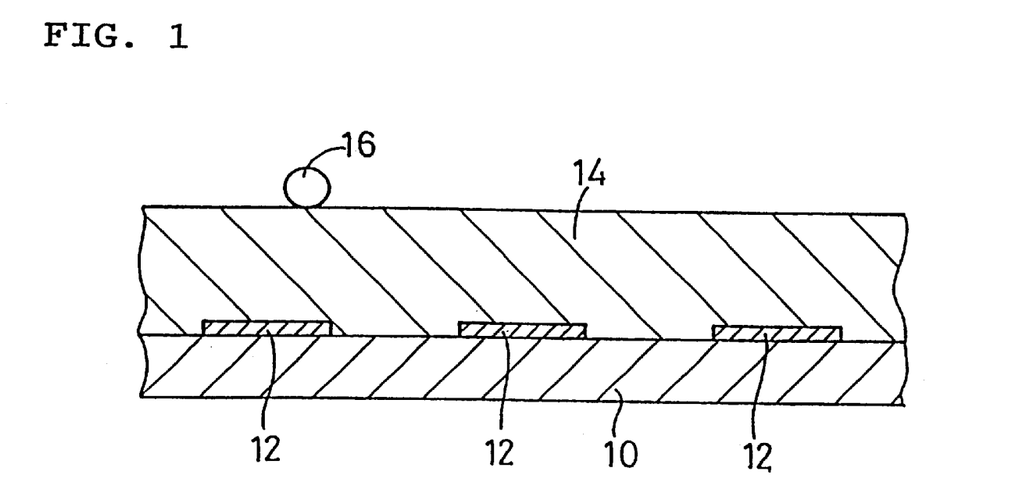
FIG. 1 is an explanatory sectional view showing a major part of a step in the method of producing a wiring board according to the present invention.

As shown in FIG. 1, a lower circuit pattern 12 is formed on a substrate 10 in the general manner, and then a photosensitive resin layer is adherently formed on the lower circuit pattern 12. The substrate 10 is not particularly limited, however, a glass epoxy substrate, a substrate of polyimide resin film, or the like can be used. As the lower circuit pattern 12, an electrically good conductor such as copper, aluminum or the like can be used, but it is not particularly limited thereto. It is preferred that after the circuit pattern 12 is formed in a predetermined pattern the surface of the lower circuit pattern 12 is roughly edged, so as to increase adhesive strength between the circuit pattern 12 and the photosensitive resin layer 14 adhering thereto.

The photosensitive resin layer 14 may be a wet type or a dry type, but it is not particularly limited thereto. When the photosensitive resin layer is a wet type, photosensitive resin layer adjusted to a certain viscosity is applied to the substrate and then spread equally by using a curtain coater or the like.

In the meanwhile, when the photosensitive resin layer 14 is a dry type, a photosensitive resin film is bonded to the substrate under a reduced pressure or in a vacuum so as to prevent air from being sandwiched between the film and the substrate. When the photosensitive resin layer 14 is a wet-type, the photosensitive resin layer 14 is applied to the substrate 10 and then it is pretreated at a predetermined temperature for a certain period of time to harden the photosensitive resin layer 14.

Figure 2:
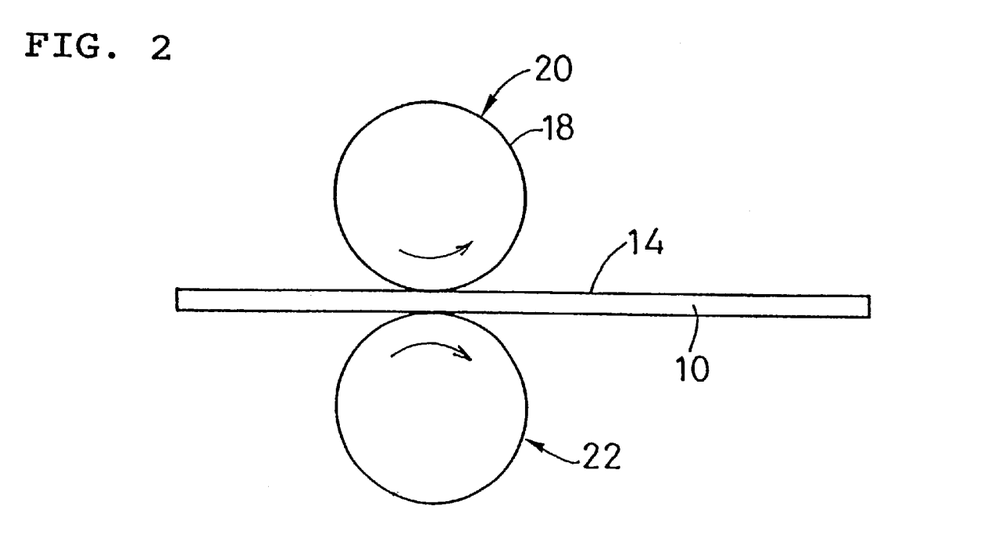
FIG. 2 is an explanatory side view showing a step of removing contaminant matter adhering to the surface of a photosensitive resin layer by using an adhesive roll in the method of producing a wiring board according to the present invention.

In such a pretreatment step, various kinds of contaminant matter such as suspended dust may often be attached to the surface of the photosensitive resin layer 14. Therefore, it is preferred that a step of removing contaminant matter 16 attached to the surface of the photosensitive resin layer 14 is also conducted. In the removing step, as shown in FIG. 2, for example, an adhesive roller 20 with adhesive agent 18 on its surface is provided on the side of photosensitive resin layer 14, and a roller 22 is provided on the other side of the substrate 10.

The adhesive roller is moved on the photosensitive resin layer with the substrate 10 sandwiched between the adhesive roller 20 and the roller 22. In this manner, being attached to the adhesive agent 18 of the adhesive roller 20, the contaminant matter 16 is removed from the surface of the photosensitive resin layer 14.

Figure 3:
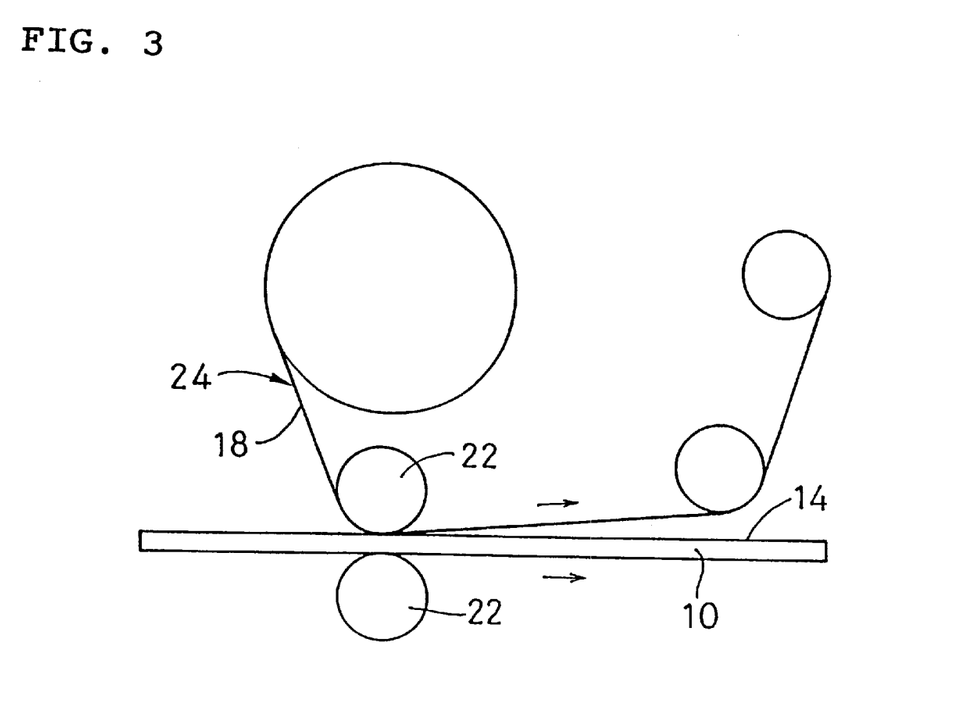
FIG. 3 is an explanatory side view showing another step of removing contaminant matter adhering to the surface of a photosensitive resin layer by using an adhesive tape in the method of producing a wiring board according to the present invention.

Further, as shown in FIG. 3, the contaminant matter 16 can be removed by using an adhesive tape 24 with adhesive agent 18 on its surface. The adhesive agent 18 of the adhesive tape 24 is in contact with the surface of the photosensitive resin layer 14, and the tape 24 and the substrate 10 are sandwiched between a pair of rollers 22. The adhesive tape 24 peeled off from the photosensitive resin layer 14 is rolled up so that the used tape 24 is never used again. In this arrangement, contaminant matter 16 adhering to the adhesive tape 24 does not adhere again to the photosensitive layer 14.

Figure 4:
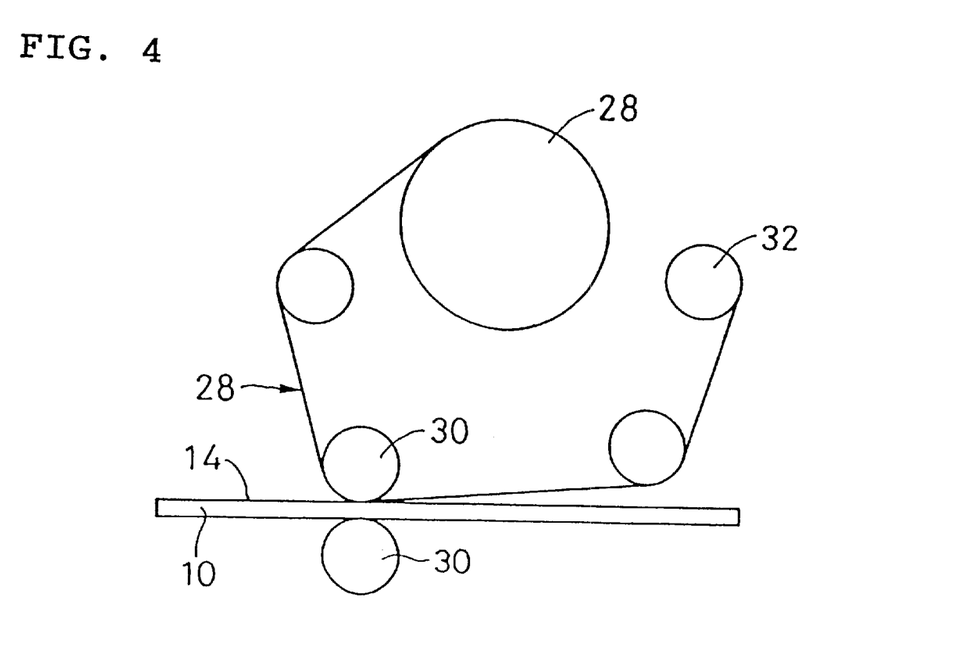
FIG. 4 is an explanatory side view showing a pressing step of a substrate in the method of producing a wiring board according to the present invention.

After contaminant matter 16 is removed from the surface of the photosensitive resin layer 14 in this manner, a pressing step is carried out for the photosensitive resin layer 14, because contaminant matter 16 is not completely removed from the photosensitive resin layer 14 by the adhesive tape 24 or the like. It is preferred that the pressing process is carried out in such a way that the photosensitive resin layer 14 is pressed with the application of heat, while the substrate 10 is sandwiched between a pair of heating rollers 30 through the tape 28. The tape 28 may be composed of either resin or metal, or may be composed of any material, preferably with a high hardness. The used tape 28 is rolled up by the roller 32 and never used again so as to prevent contaminant matter adhering to the tape 28 from adhering again to the photosensitive layer 14. Also, the heating rollers 30 are not particularly limited, but preferably, the rollers have a certain level of elasticity so as not to damage the substrate 10 and the like.

Figure 5:
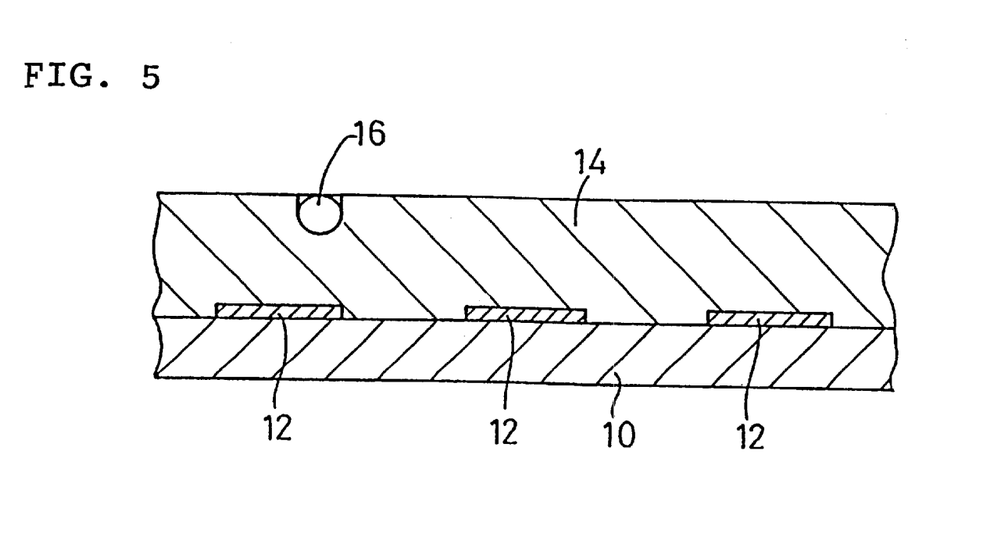
FIG. 5 is an explanatory sectional view showing a major part of a step, in which contaminant matter is pressed into a photosensitive resin layer, in the method of producing a wiring board according to the present invention.

During this pressing process, contaminant matter 16 adhering to the surface of the photosensitive resin layer 14 is pressed into the photosensitive resin layer 14, as shown in FIG. 5. Heating temperature of the heating roller 30 is preferably a softening temperature or more of the photosensitive resin layer 14. If the photosensitive resin layer 14 is so soft that the contaminant matter 16 can be easily pressed thereinto, the photosensitive resin layer does not need to be heated. However, if the photosensitive resin layer 14 is so hard that the contaminant matter 16 cannot be pressed thereinto, it is preferred that the photosensitive resin layer 14 should be heated to be softened, while the contaminant matter 16 is bonded to the photosensitive resin layer.

Figure 6:
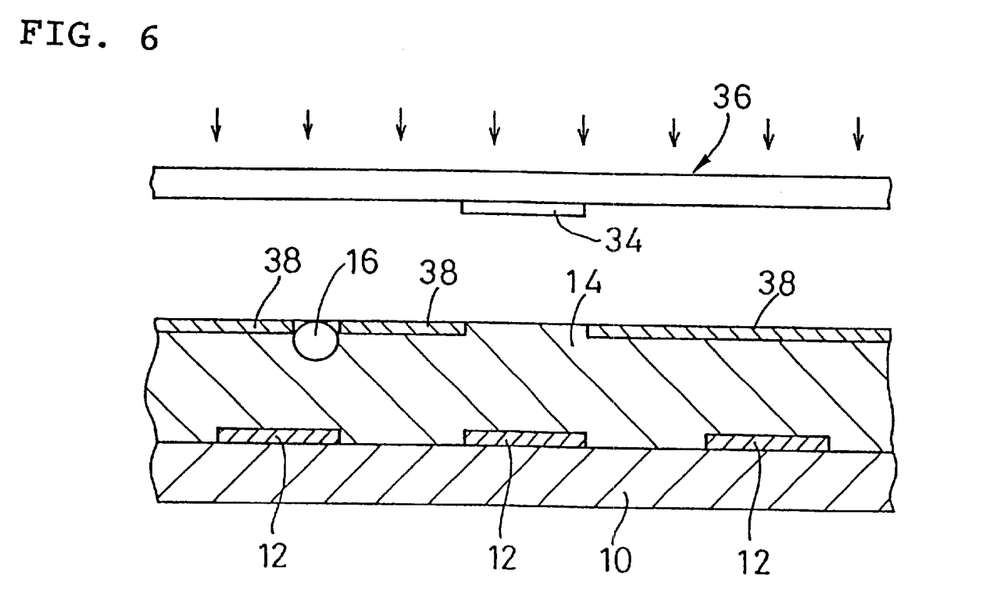
FIG. 6 is an explanatory sectional view showing a major part of an exposing step in the method of producing a wiring board according to the present invention.
Figure 7A:
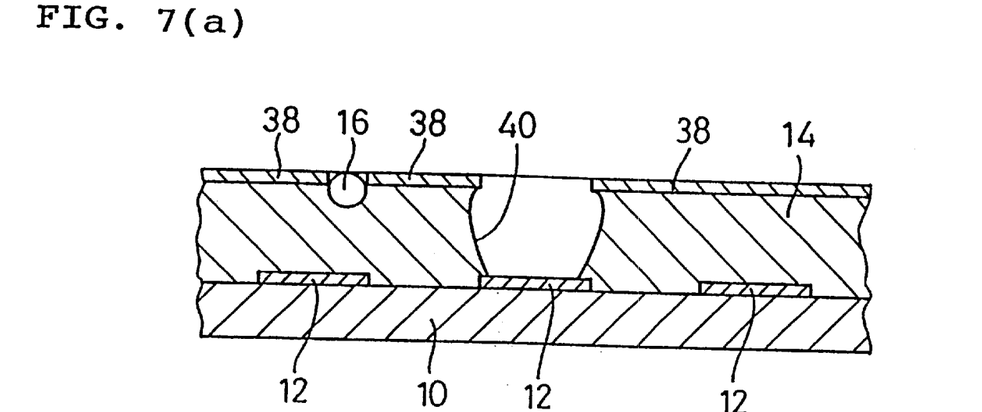
FIGS. 7(a) to 7(d) are explanatory sectional views showing major parts of steps in the method of producing a wiring board according to the present invention.

After the pressing process, a photomask 36, on which a predetermined shielding pattern 34 is formed, is positioned, and the photosensitive resin layer 14 is exposed to light, as shown in FIG. 6. By exposing light to the layer 14, a photo-cured layer is formed on the surface of the layer 14, and by developing the layer 14, a via hole 40 is formed as shown in FIG. 7(a). At this time, since contaminant matter 16 densely adheres to the surface of the layer 14, developer does not pass through the contaminant matter 16 and the photo-cured layer 38, so that it does not melt the layer 14 and thus no voids or bubbles are created.

Figure 7B:
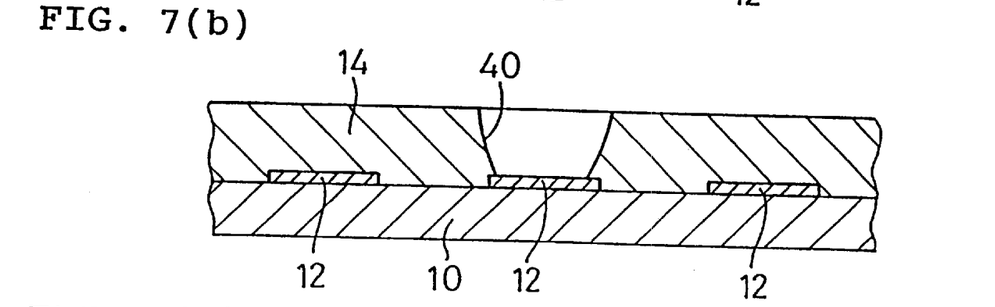
Figure 7C:
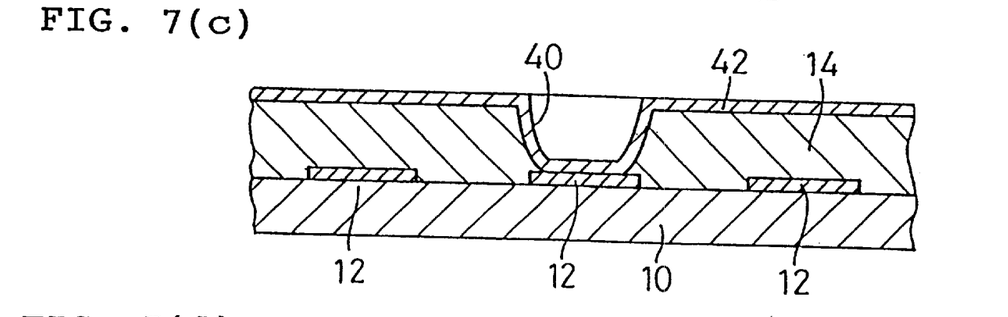
Figure 7D:
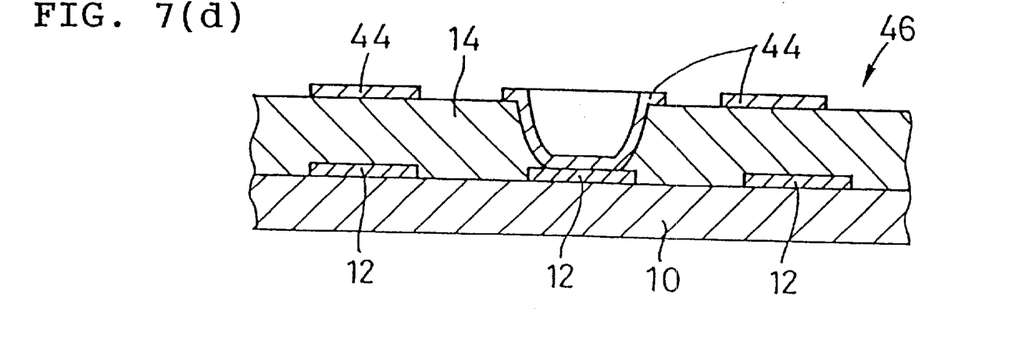

Thereafter, the photosensitive resin layer 14 is treated in a general manner to produce a wiring board. For example, as shown in FIG. 7(b), after the surface of the layer 14 is removed by being ground, the layer 14 is heat treated to be cured. Then, as shown in FIG. 7(c), a conductive layer 42 is adherently formed on the photosensitive resin layer 14 by using copper and the like. Further, as shown in FIG. 7(d), the conductive layer 42 is formed into a predetermined circuit pattern 44 by using the lithography method, and thus the wiring board 46 is produced.

On the wiring board 46 produced in the above method, no voids or bubbles are created because contaminant matter 16 such as suspended dust are pressed into the layer 14 and not on the surface of the layer 14. Therefore, no short circuit occurs between the circuit patterns 12 and 44, which sandwich the insulating layer (photosensitive resin layer) 14. In addition, withstand voltage between them is not reduced.

The lithography method and the method for producing a wiring board according to the present invention have thus been descried, however, the present invention is not limited to the above embodiment.

Figure 8:
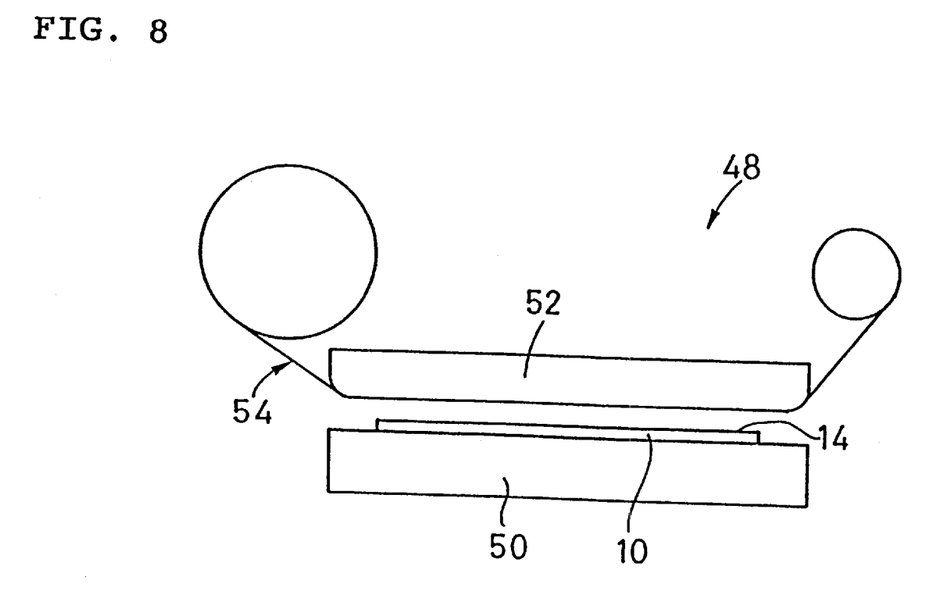
FIG. 8 is an explanatory side view showing another pressing step of a substrate in the method of producing a wiring board according to the present invention.

For example, the pressing process, in which the contaminant matter 16 is pressed into the photosensitive resin layer 14, can be carried out by using a hot pressing apparatus 48, as shown in FIG. 8. The hot pressing apparatus 48 comprises a lower hot plate 50 and an upper hot plate 52, which sandwich the substrate 10 to hot press it. It is preferred that a tape feeding apparatus for tape 54 is provided on the side of the layer 14 formed on the substrate 10 so that the clean tape 54 is always in contact with the layer 14.

Figure 9:
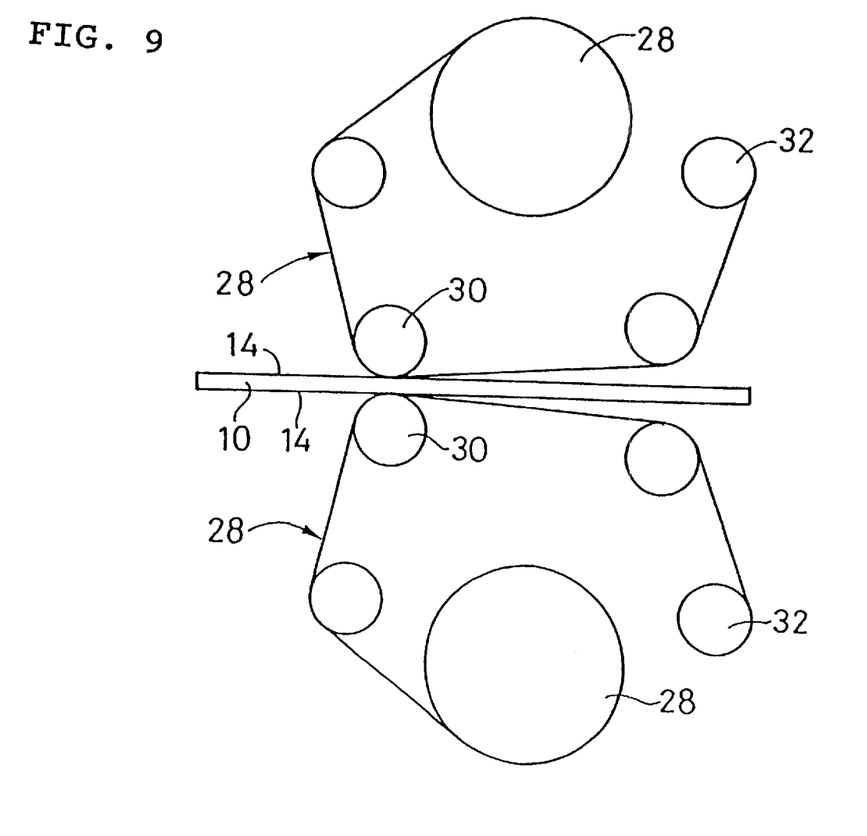
FIG. 9 is an explanatory side view showing a further pressing process of a substrate in the method of producing a wiring board according to the present invention.

In the case where the photosensitive resin layers 14 are formed on both sides of the substrate 10, tape feeding apparatuses for tapes 28 can be provided on both sides of the substrate 10, so as to hot press both sides of the substrate 10 through the tapes 28 by sandwiching the substrate 10 between the heating rollers 30, as shown in FIG. 9.

Figure 10:
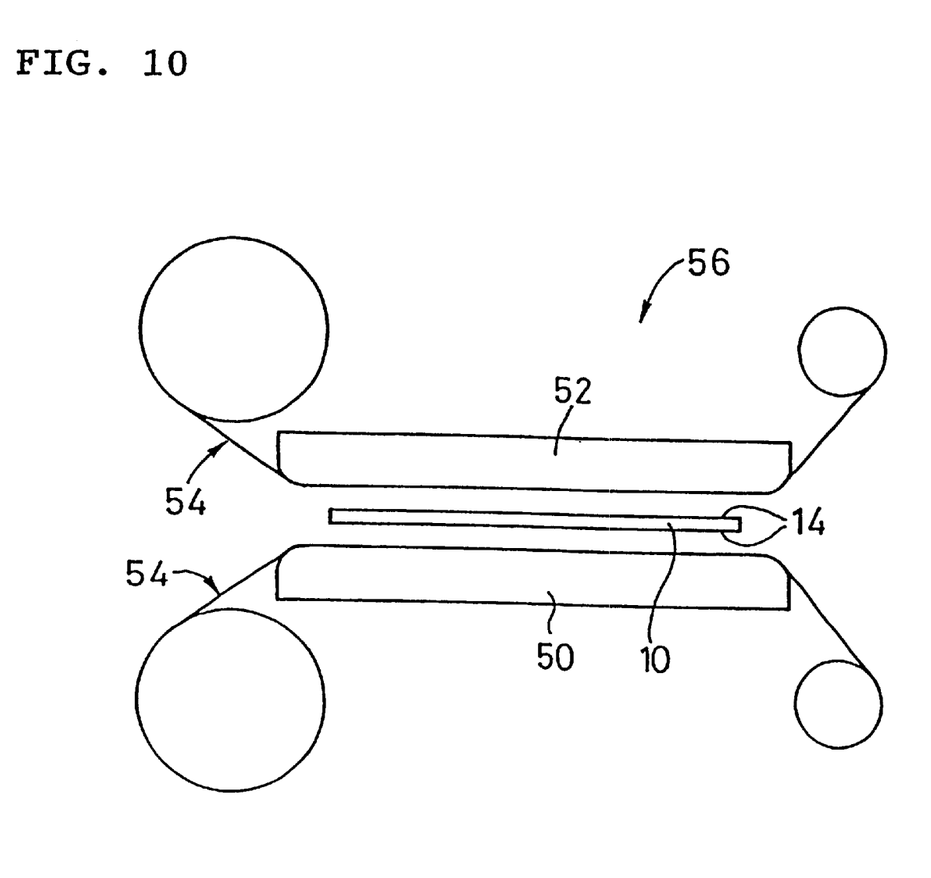
FIG. 10 is an explanatory side view showing a still further pressing process of a substrate in the method of producing a wiring board according to the present invention.

Further, in the case where the photosensitive resin layers 14 are formed on both sides of the substrate 10, the pressing process can be carried out by using a hot pressing apparatus 56. As shown in FIG. 10, the hot pressing apparatus 56 may comprise a lower hot plate 50 and an upper hot plate 52, which sandwich the substrate 10 to hot press it. As in the case of the above embodiment, it is preferred in this embodiment that the tape feeding apparatuses for tapes 54 are provided on both sides of the substrate 10 so that clean tapes 54 are always in contact with the layers 14 formed on both sides of the substrate 10.

Figure 11A:
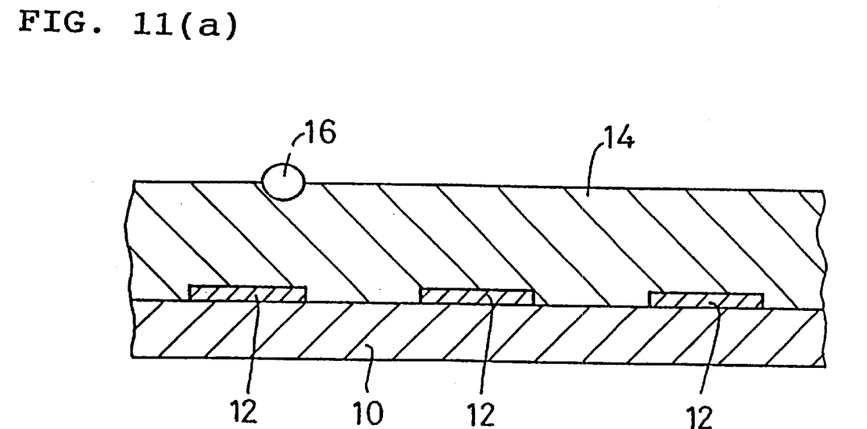
FIGS. 11(a) to 11(c) are explanatory sectional views showing major parts of major steps in another method of producing a wiring board according to the present invention.
Figures 11B, 11C:
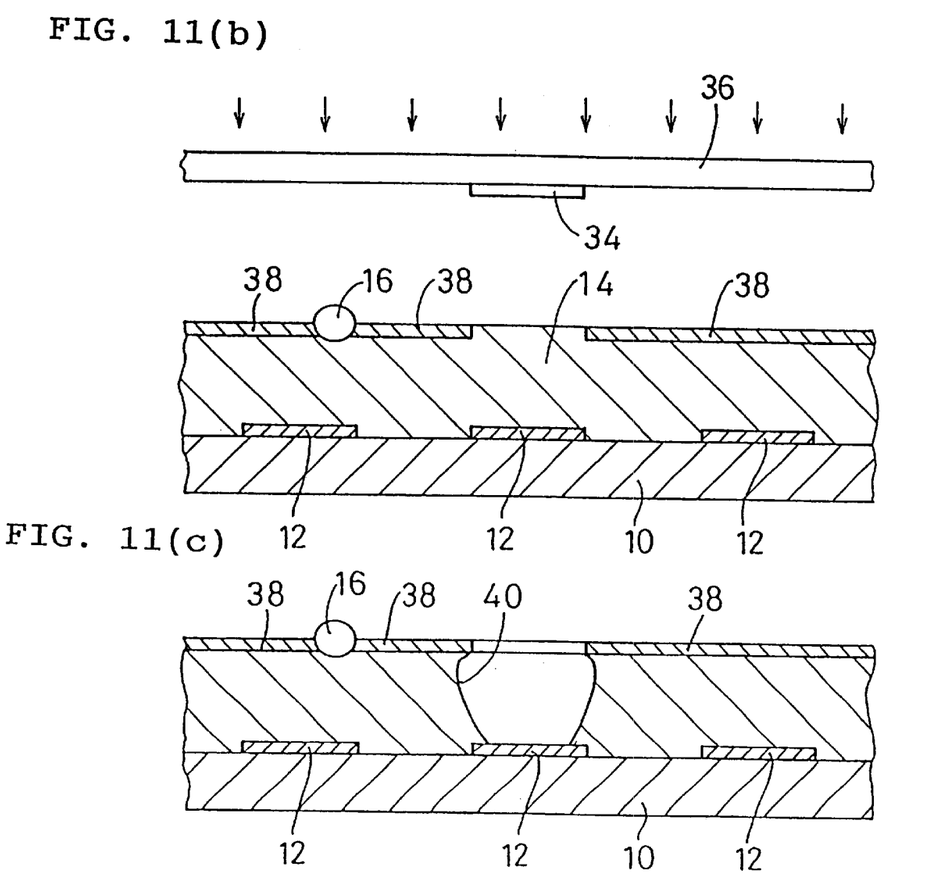

In pressing the contaminant matter 16 into the photosensitive resin layer 14, the contaminant matter 16 is not necessarily pressed all the way into the layer 14, but they are simply pressed into and bonded to the layer 14 so as not to come off from the photosensitive resin layer 14, as shown in FIG. 11(a). In other words, the contaminant matter 16 is so pushed that, after the photosensitive resin layer 14 is exposed to light as shown in FIG. 11(b), the contaminant matter 16 can be incorporated as a part of a photo-cured layer 38 in the developing step as shown in FIG. 11(c) to protect the uncured photosensitive resin layer 14 from being developed.

The case where the contaminant matter 16 is incorporated as a part of the photo-cured layer 38 by light exposure has thus been described in the above embodiments. However, if the contaminant matter is on a part of the photosensitive resin layer 14 which is not exposed to light, it is removed together with photosensitive resin layer 14 in the developing step as usual, thus no problem arises.

Figure 12A:
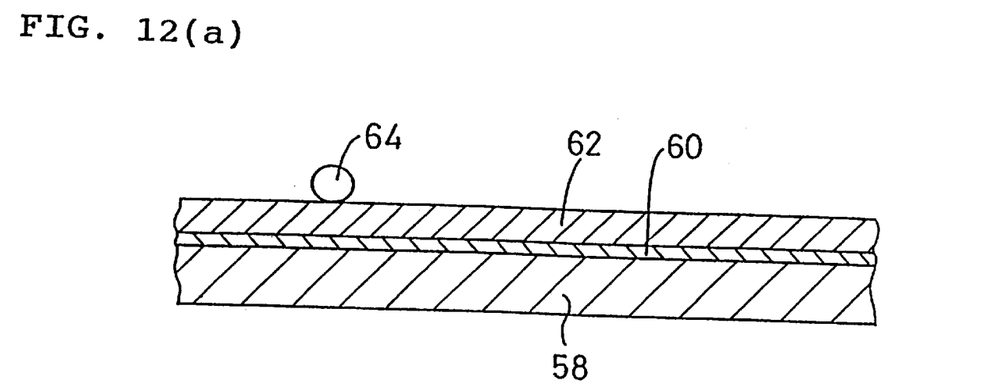
FIGS. 12(a) to 12(c) are explanatory sectional views showing major parts of major steps in still another method of producing a wiring board according to the present invention.
Figure 12B:
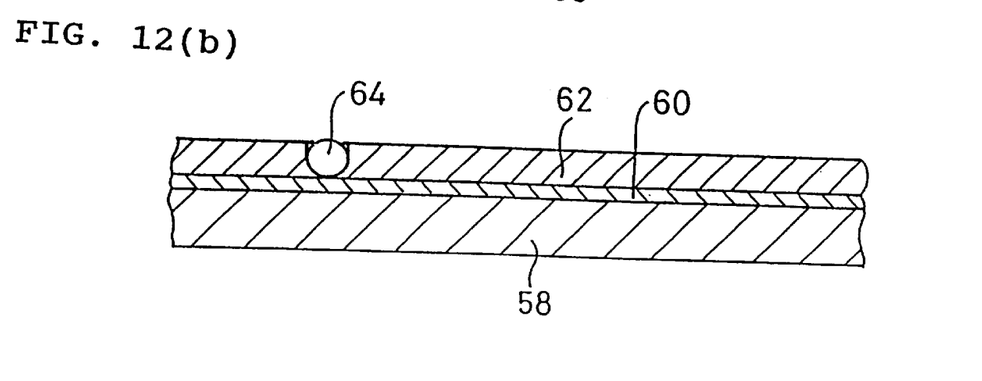

The method of producing the so-called build-up type of a wiring board has been described in the above embodiments, however, the present invention is not limited thereto. For example, as shown in FIG. 12(a), a conductive layer 60, that is, a work layer, is formed on the substrate 58 and then a photosensitive resin layer 62 is formed on the conductive layer 60. Then, after contaminant matter 64 is removed from the surface of the photosensitive resin layer 62 by using an adhesive agent when necessary, the contaminant matter 64 is pressed into the photosensitive resin layer 62, as shown in FIG. 12(b). At this time, it is preferred that the pressure is set according to the relationship between the size of the contaminant matter 64 to be attached and the thickness of the photosensitive resin layer 62. It is also preferred that the photosensitive resin layer 62 is pressed while being heated to a softening temperature or more.

Figure 12C:
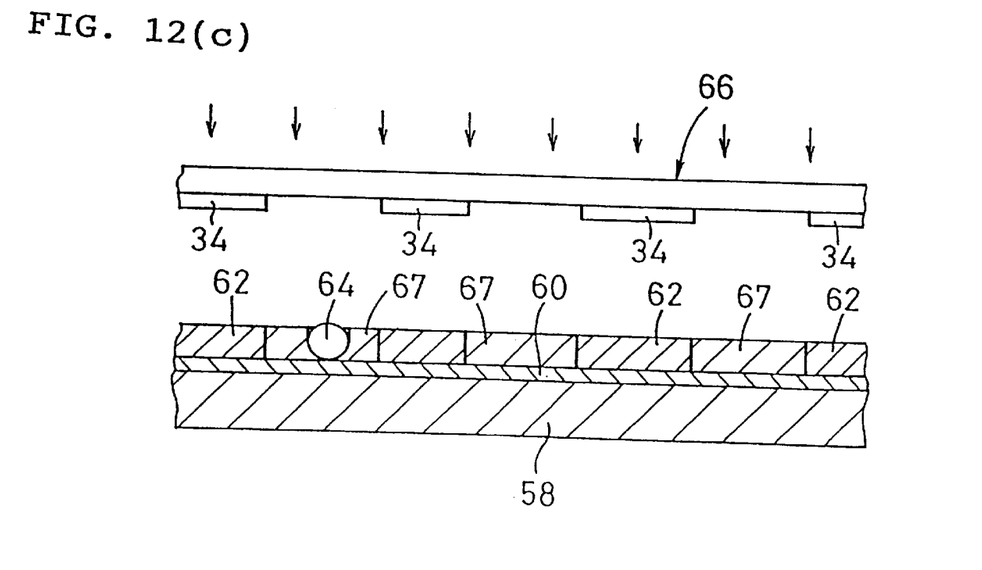
Figure 13A:
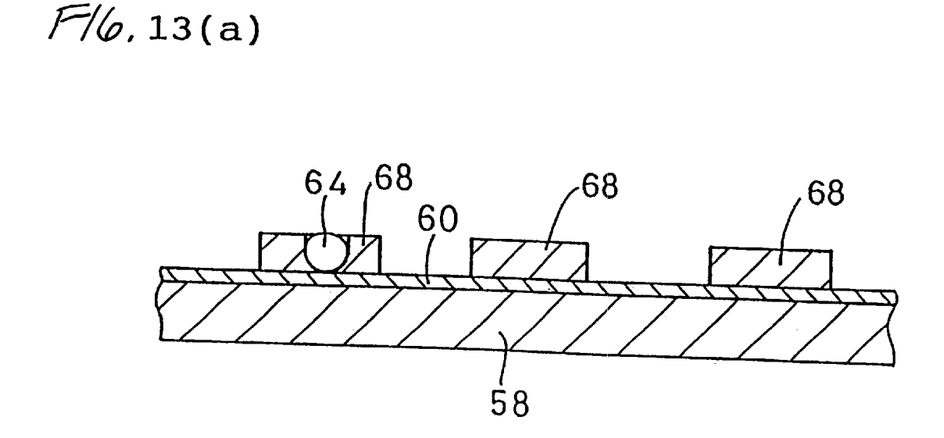
FIGS. 13(a) to 13(c) are explanatory sectional views showing major parts of steps subsequent to the steps shown in FIGS. 12(a) to 12(c) in the method of producing a wiring board according to the present invention.
Figure 13B:
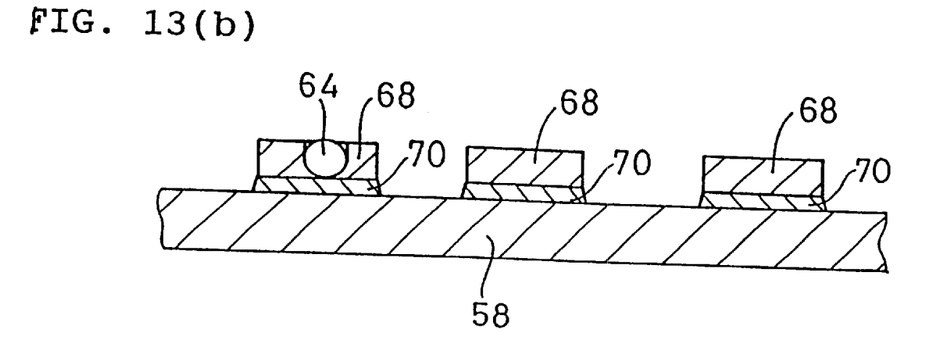
Figure 13C:
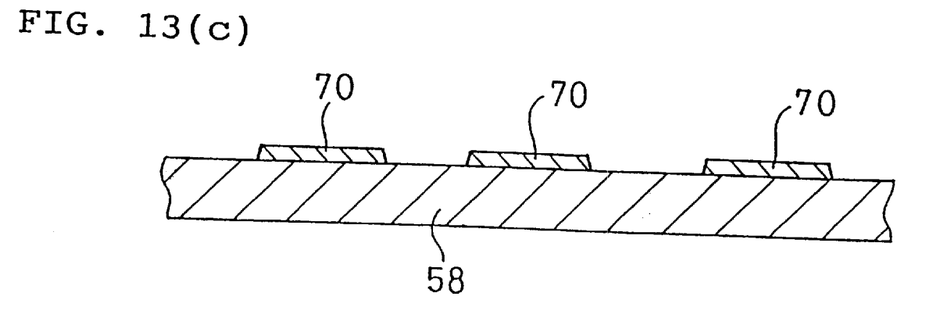

Next, as shown in FIG. 12(c), a mask 66, on which a predetermined shielding pattern is formed, is positioned in a general manner and then it is exposed to light to form photo-cured parts 67. Then, as shown in FIG. 13(a), after the photosensitive resin layer 62 is developed to form a resist 68, it is heat-treated when necessary. Thereafter, the conductive layer 60 is etched to form a circuit pattern 70 as shown in FIG. 13(b), and the resist 69 is removed as shown in FIG. 13(c). Thus, a wiring board, on which a circuit pattern 70 is formed on the substrate 58, is finally produced.

In the above-described method of producing wiring board, the formed electrode can be prevented from being broken or shortening out by conducting, before light exposure, a pressing process in which the contaminant matter is pressed into the photosensitive resin layer so as not to come off from the photosensitive resin layer.

Further, the lithography method applied to the above-described method of producing a wiring board is applicable to the method of producing a semiconductor device, and preferably it is applicable to the patterning of a semiconductor layer. Thus the lithography method of the present invention can be widely applied to the method of producing a semiconductor device. In addition, various changes, alternations and modifications, which are not shown, may be made to the embodiments on the basis of knowledge of those skilled in the art without departing from the scope and spirit of the present invention.

The assumption that dust adhering to the surface of a panel (substrate) may cause the creation of dented parts (bubbles) with a diameter of 20 to 30 micrometers in the center of the surface of the panel was verified by the following Example and Comparative Example. As a substitute of dust, soldering paste was used. Since solder of soldering paste agglomerate after being cleaned with acetone and dried, the solder paste was dispersed in isopropyl alcohol.

Double-sided copper clad laminates (NIP) having a thickness of 1.4 mm were used as the panels. The surface of each panel was roughened in a general manner, and then it was coated with a photosensitive resin layer (Probimer). To be precise, a mat agent LSP337(C-2) was mixed with Probimer, and then the mixture was applied to the surfaces of each panel with a Curtain coater #2. The amount of the mixture applied to the surface of each panel was 15.4 g/600 cm$^2$ and the viscosity of the mixture, which was measured according to the DIN Cup #4, was 1820 cps (2 rpm) or 176 seconds if it is represented on the time scale. Thereafter, the photosensitive resin layer applied to the surface of each panel was precured at 90° C. for 30 minutes. After precuring process was completed, soldering balls were scattered on the surface of each panel with a brush as substitutes of dust.

Next, the panels were divided into two groups before exposing them to light. One group consists of panels which were not specially treated (Comparative Example), and the other group consists of panels whose surfaces were pressed by using the film applying apparatus (Example). Unlike in a general manner, in order to preclude other factors, both groups of panels were placed on the Mylar frame and then they were exposed to light by using the pilot line manual exposure equipment. At that time, the energy of exposure was 2000 mJ. Thereafter, the photosensitive resin layers on the panels were developed at the same condition of Probimer 52 (conveying speed of approximately 15 m/min) and then cured at 135° C. for 2 hours.

First, a 100-times microscope photograph of soldering balls adhering to the surfaces of each panel was taken. It was found that the diameters of the soldering balls were 10 to 30 micrometers, which were substantially the same size as the dented part in the center of a bubble usually created. One-eighth-size sample panels, that is, one sample panel from each group, were observed under the stereomicroscope (15 times) and the number of defects were measured. Since there were a plenty of tiny dented parts, however, only such parts that were dented to the laminate (NIP) were counted as voids. Results of the measurements are shown in Table 1.

In the case where foreign objects to block off the light were placed on the surface of the panel, both voids and bubbles were created. In the meanwhile, in the case where the surface of the panel was pressed by the roller, the numbers of voids and bubbles were sharply reduced. When soldering balls were placed on the surface of the photosensitive resin layer, they cast shadows over the surface of the photosensitive resin layer. These shadows created unexposed parts on the photo-cured layer, and the soldering balls were removed from the surface of the photosensitive resin layer in the developing step, thus voids or bubbles were created. On the contrary, when soldering balls were pressed into the photosensitive resin layer by the roller, little shadows were cast over the surface of the photosensitive resin layer, so that the numbers of voids and bubbles are substantially reduced.

When the surface of the photosensitive resin layer exposed to light with soldering balls on its surface was observed after being developed and cured, small dented parts (marks on the resin created by removing soldering balls in the developing step) were found all over the surface, and some of them accompanied bubbles. However, no soldering balls were found. In the mean while, when the surface of the photosensitive resin layer pressed by the roller was observed, it was found that most soldering balls were not removed in the developing step but they were embedded in the photosensitive resin layer, and the rest of the minute soldering balls which were not embedded were left on the surface as minute dented parts.

As clear from the above results, when the substrate is exposed to light while lightproof foreign objects with a diameter of 20 to 30 micrometers adhere to the surface of the photosensitive resin layer, voids are created and some of them are turned into bubbles. On the contrary, even if lightproof foreign objects with a diameter of 20 to 30 micrometers adhere to the surface of the photosensitive resin layer, when they are pressed into the photosensitive resin layer, the creation of voids and bubbles can be prevented.

The lithography method and the method of producing a wiring board according to the present invention comprise a pressing step wherein, by pressing at least the surface of the photosensitive resin layer prior to a developing step, contaminant matter is pressed into the photosensitive resin layer so as not to come off from the photosensitive resin layer at least in an etching step. Since contaminant matter is incorporated into a part of the photosensitive resin layer in this pressing step, no voids or bubbles are created on the photosensitive resin layer. Therefore, in the case of producing a laminated wiring board, for example, neither short circuit nor reduction of withstand voltage occurs between the lower circuit pattern and the upper circuit pattern.

While there have been shown and described what are at present the preferred embodiments of the invention, it will be obvious to those skilled in the art that various changes and modifications may be made therein without departing from the scope of the invention as defined by the appended claims.

What is claimed is:

1. A lithography method comprising the steps of:
    preparing a photosensitive resin layer;
    pressing the photosensitive resin layer;
    exposing the pressed photosensitive resin layer to light by using an exposure mask; and
    developing the exposed photosensitive resin layer.

2. The lithography method according to claim 1, wherein said pressing step includes the step of pressing contaminant matter adhering to the surface of the photosensitive resin layer into the photosensitive resin layer, so that the contaminant matter does not come off from the surface of the photosensitive resin layer in the subsequent steps.

3. The lithography method according to claim 2, wherein said contaminant matter is large enough to create voids in the photosensitive resin layer in said developing step.

4. The lithography method according to claim 1 or 2, wherein said pressing step includes the step of pressing the photosensitive resin layer with the application of heat.

5. The lithography method according to claim 4, wherein said pressing step includes the step of pressing the photosensitive resin layer under the temperature equal to or more than the softening temperature of the photosensitive resin.

6. The lithography method according to claims 1 to 5, wherein said pressing step includes the step of pressing the photosensitive resin layer with a heated roller or plate.

7. The lithography method according to claim 1, further comprising the step of removing contaminant matter adhering to the surface of the photosensitive resin layer prior to the pressing step.

8. The lithography method according to claim 7, wherein said step of removing contaminant matter includes the step of removing contaminant matter by pressing an adhesive agent onto the surface of the photosensitive resin layer.

9. The lithography method according to claim 1,
    wherein said step of preparing a photosensitive resin layer comprises the substeps of forming a photosensitive resin layer on a work layer; and
    which further comprises the steps of etching the work layer after said developing step.

10. A method for producing a wiring board comprising the steps of:
   preparing a photosensitive resin layer;
   pressing the photosensitive resin layer;
   exposing the pressed photosensitive resin layer to light by using a photomask on which a predetermined wiring pattern is formed; and
   developing the exposed photosensitive resin layer.

11. The method for producing a wiring board according to claim 10, wherein said pressing step includes the step of pressing contaminant matter adhering to the surface of the photosensitive resin layer into the photosensitive resin layer, so that the contaminant matter does not come off from the surface of the photosensitive resin layer in the subsequent steps.

12. The method for producing a wiring board according to claim 11, wherein said contaminant matter is large enough to create voids in the photosensitive resin layer in said developing step.

13. The method for producing a wiring board according to claims 10 to 12, wherein said pressing step includes the step of pressing the photosensitive resin layer with a heated roller or plate.

14. The method for producing a wiring board according to claim 10, wherein said wiring board is a built-up laminate.

15. The method for producing a wiring board according to claim 10,
   wherein said step of preparing a photosensitive resin layer comprises the substeps of forming a photosensitive resin layer on a conductive layer provided on a substrate; and
   which further comprises the step of etching the conductive layer after said developing step.

* * * * *